United States Patent
Adachi et al.

(10) Patent No.: US 6,790,675 B2
(45) Date of Patent: Sep. 14, 2004

(54) JOSEPHSON DEVICE AND FABRICATION PROCESS THEREOF

(75) Inventors: Seiji Adachi, Inzai (JP); Hironori Wakana, Tochigi (JP); Yoshihiro Ishimaru, Yokohama (JP); Masahiro Horibe, Funabashi (JP); Osami Horibe, Tokyo (JP); Yoshinobu Tarutani, Tokyo (JP); Keiichi Tanabe, Mito (JP)

(73) Assignees: International Superconductivity Technology Center, Tokyo (JP); The Juridical Foundation, Tokyo (JP)

( * ) Notice: Subject to any disclaimer, the term of this patent is extended or adjusted under 35 U.S.C. 154(b) by 0 days.

(21) Appl. No.: 10/391,412

(22) Filed: Mar. 18, 2003

(65) Prior Publication Data

US 2003/0186467 A1 Oct. 2, 2003

(30) Foreign Application Priority Data

Mar. 26, 2002 (JP) .................................. 2002-086896

(51) Int. Cl.[7] .............................................. H01L 21/00
(52) U.S. Cl. ............................. 438/2; 257/31; 257/32; 257/33; 257/36; 29/599
(58) Field of Search ............................... 438/2; 29/599, 29/25.01, 25.02, 25.03; 427/62; 204/192.24; 505/725; 257/31–36

(56) References Cited

U.S. PATENT DOCUMENTS

| | | | | |
|---|---|---|---|---|
| 4,177,476 A | * | 12/1979 | Kroger et al. ................. | 257/35 |
| 4,983,575 A | * | 1/1991 | Komuro et al. .............. | 505/238 |
| 5,028,583 A | | 7/1991 | Tanaka et al. ................... | 505/1 |
| 5,509,183 A | * | 4/1996 | Nakamura et al. ......... | 29/25.01 |
| 5,643,428 A | * | 7/1997 | Krivokapic et al. ... | 204/298.11 |
| 5,939,730 A | * | 8/1999 | Durand et al. ................. | 257/31 |
| 6,066,600 A | * | 5/2000 | Chan ........................... | 505/329 |
| 6,188,919 B1 | * | 2/2001 | LaGraff et al. .............. | 505/190 |
| 6,353,234 B1 | * | 3/2002 | Faley et al. .................... | 257/31 |
| 6,476,413 B1 | * | 11/2002 | Jia et al. ........................ | 257/33 |
| 6,699,375 B1 | * | 3/2004 | Crocker ................. | 204/298.15 |
| 2002/0074626 A1 | * | 6/2002 | Nagano et al. ............. | 257/661 |

FOREIGN PATENT DOCUMENTS

| | | | | |
|---|---|---|---|---|
| EP | 0322306 | 6/1989 | | |
| JP | 1145878 | 6/1989 | | |
| JP | 1188661 | 7/1989 | | |
| JP | 02271687 A | * | 11/1990 | ........... H01L/39/24 |
| JP | 2277275 | 11/1990 | | |
| JP | 537030 | 2/1993 | | |
| JP | 06263588 | 9/1994 | | |
| JP | 1074989 | 3/1998 | | |
| JP | 2000-150974 | 5/2000 | | |
| JP | 2002141564 | 5/2002 | | |

OTHER PUBLICATIONS

Laubacher et al., "Processing and Yield of Y1Ba2Cu3O7–x Thin Films and Devices Produced with a BaF2 Process", IEEE Transactions on Magnetics, vol. 27, No. 2, Mar. 1991.*

(List continued on next page.)

*Primary Examiner*—John F. Niebling
*Assistant Examiner*—Jennifer M. Kennedy
(74) *Attorney, Agent, or Firm*—Ladas & Parry

(57) ABSTRACT

A method of fabricating a Josephson device includes the steps of forming a first superconducting layer and forming a second superconducting layer to form a Josephson junction therebetween, wherein the step of forming the second superconducting layer includes the steps of conducting a first step of forming the second superconducting layer with improved uniformity and conducting a second step of forming the second superconducting layer on the second superconducting layer formed in the first step with improved film quality.

9 Claims, 7 Drawing Sheets

OTHER PUBLICATIONS

Japanese Laid–Open Patent Publication 2000–150974 and English abstract. May 30, 2000.

Bednorz, J.G. and K.A. Muller. "Possible High Tc Superconductivity in the Ba–La–Cu–O system", Z. Phys. B., 64(2), (1986), pp. 189–193.

Takada, Susumu. "Present status of High Tc superconducting election devices", Oyo–Baturi, 62 (5), (1993), pp. 443–454.

Hidaka, M., et al. "High–resolution measurements using high–Tc superconductor materials", Oyo–Baturi, 67(10), (1998), pp. 1167–1170.

Moeckly, B.H. and K. Char. "Properties of interface–engineered high Tc Josephson junctions", Appl. Phys. Lett., 71(17), (Oct. 27, 1997), pp. 2526–2828.

Wen, J.G., et al. "Identification of Barrier in the Modified Interface High–Tc Josephson Junction by TEM", Advances in Superconductivity XII —Proc. ISS 1999, in Morioka, pp. 984–989.

Soutome, Y., et al. "Analysis of the surface–modified barrier in YbaCuO ramp–edge Josephson junctions", Advances in Superconductivity XII —Proc. ISS 1999, in Morioka, pp. 990–992.

Talvacchio, J., et al. "Materials Basis for a Six–Level Epitaxial HTS Digital Circuit Process", IEEE Transactions on Applied Superconductivity, 7(2), (Jun. 1997), pp. 2051–2056.

Satoh, T., et al. "High–Temperature Superconducting Edge–Type Josephson Juncrions with Modified Interfaces", IEEE Transactions on Applied Superconductivity, 9(2), (Jun. 1999), pp. 3141–3144.

Wen, J.G., et al. "Atomic structure and composition of the barrier in the modified interface high–Tc Jpsephson junction studied by transmission electron microscopy", Appl. Phys. Lett., 75(16), (Oct. 18,1999), pp. 2470–2472.

Soutome, Y., et al. "Fabrication of ramp–edge junctions with surface–modified barriers on groundplanes", $62^{nd}$ Annual Meeting of Japan Society of Applied Physics 14a–G–7, Sep. 11–14, 2001, Abstract No. 1, p. 195.

English Abstract of JP 10–074989 Dated Mar. 17, 1998.

English Abstracts of JP 05–037030 Dated Feb. 12, 1993.

English Abstract of JP 02–277275 Dated Nov. 13, 1990.

English Abstract of JP 01–145878 Dated Jun. 7, 1989.

English Abstract of JP 06–263588 Dated Sep. 20, 1994.

English Abstract of JP 2002–141564 Dated May 17, 2002.

Makita, T., et al., "Fabrication and Characterization ... Barrier"; IEEE Trans. Appl. on Applied Superconductivity; vol. 11, No. 1, (2001); pp. 155–158.

Makita T.,et al., Fabrication of Ramp–Edge Junction with NdBa2Cu3Oy–Based Interface–Modified Barrier; JPN. J. Appl. Phys. vol. 39 (2000), PP L730–L732.

* cited by examiner

JOSEPHSON DEVICE AND FABRICATION PROCESS THEREOF

CROSS-REFERENCE TO RELATED APPLICATIONS

The present application is based on Japanese priority application No.2002-086896 filed on Mar. 26, 2002, the entire contents of which are hereby incorporated by reference.

BACKGROUND OF THE INVENTION

The present invention relates to fabrication method of Josephson devices that use a superconductor, and more particularly to the method of fabricating a Josephson device that uses an oxide superconductor while minimizing the variation of operational characteristics of the Josephson junction formed therein.

A superconductor has a unique property characterized by: 1) zero electric resistance; 2) complete diamagnetism; 3) Josephson effect, and application thereof is expected in various fields including electric power transfer, electric power generation, confinement of nuclear fusion plasma, magnetically levitated trains, magnetic shield, high-speed computers, and the like.

In 1986, Bednorz and Mueller discovered a copper oxide superconductor $(La_{1-x}Ba_x)_2CuO_4$ that has a very high superconducting transition temperature Tc of about 30K. Thereafter, numerous reports followed, reporting observation of superconducting transition occurring at high temperatures particularly in the systems of $YBa_2Cu_3O_{7-y}$ (Tc=90K), $Bi_2Sr_2Ca_2Cu_3O_y$ (Tc=110K) $Tl_2Ba_2Ca_2Cu_3Oy$ (Tc=125K), $HgBa_2Ca_2Cu_3Oy$ (Tc=135K), and the like. Currently, investigations are being made on the method of producing these materials as well as the properties and applications of these materials.

Particularly, the superconductor of $YBa_2Cu_3Oy$ is thought as the most promising material in relation to the application to electron devices or conductor wires, in view of the preferable nature of the material such as absence of toxic elements such as Tl or Hg and small anisotropy of superconductivity.

In order to use Josephson effect in electron devices, on the other hand, it is necessary to establish the process of forming a Josephson junction by using a thin-film technology.

Generally, a Josephson junction constituting the essential part of a Josephson device is formed by a physical vapor deposition process in which a source material is dispersed into a gaseous phase by exciting the source material in a vacuum vessel, such as sputtering process; laser ablation process; vacuum evaporation deposition process; molecular beam epitaxy, and the like. Further, various structures are proposed for the Josephson devices that use a copper oxide superconductor, such as bicrystal structure, biepitaxial structure, step-edge structure, ramp-edge structure, laminated structure, and the like (S. Takada, Oyo-Buturi, 62, pp.443, 1993). Particularly, the Josephson device of the ramp-edge structure is thought most promising in view of the fact that a large driving power is achieved at the time of switching and that the critical current can be changed by controlling the thickness of the tunneling barrier layer (M. Hidaka, et al., Oyo-Buturi, 67, pp.1167, 1998).

An Ic.Rn product is an index representing the performance of a Josephson junction. Larger the Ic.Rn product, the better the operational speed of the Josephson junction. An Ic.Rn product is defined as a product of a critical current Ic and a resistivity Rn, wherein the critical current Ic is the maximum current possible in the superconducting state of a superconductor at a certain temperature, while the resistivity Rn is the resistivity for the case the superconducting state is lost and the superconductor has returned to a normal conducting state.

It should be noted that the Ic.Rn product is normalized by the size of the Josephson junction. Qualitatively, the Ic.Rn product represents the magnitude of the signal achieved at the time of the switching of the Josephson junction. By using the Josephson device of the ramp-edge structure, an Ic.Rn product larger than other device structures is obtained. Typically, $YBa_2Cu_2Oy$ is used for the upper and lower superconducting electrodes. On the other hand, investigations are made also on the Josephson devices of the laminated structure, which is thought advantageous for formation of future large-scale integrated circuits. In both cases, the Josephson junction uses any of a $PrBa_2Cu_3Oy$ layer, an Nb doped $SrTiO_3$ layer or a damaged layer formed at the time of processing, for the junction barrier.

Recently, active investigation is being made on the certain type of Josephson devices that use a damaged layer formed at the time of processing, for the formation of the Josephson junction. This type of Josephson junction is called IEJ (Interface-Engineered, Junction). Reference should be made to B. H. Moeckly, et al., Appl. Phys. Lett.71, pp.2526, 1997). In the Josephson device having the ramp-edge structure, formation of a very thin layer having a thickness of 1–2 nm is confirmed by transmission electron microscopy. It is believed that this very thin layer functions as the Josephson junction, while detailed mechanism thereof is not yet understood (J. G. Wen et al. "Advances in Superconductivity XII"-Proc. ISS '99, 10/17–19, pp. 984, 1999 in Morioka, Y. Soutome, et al., "Advances in Superconductivity XII"-Proc. ISS '99, 10/17–19, pp.990, 1999, in Morioka).

In the foregoing IEJ Josephson devices, there can occur short-circuit in the Josephson junction at various locations in the case the process parameter at the time of formation of the Josephson junction is not appropriate. For example, the thickness of the damaged layer is so thin that control of thickness of the damaged layer is difficult.

It should be noted that the I-V characteristics of a Josephson device changes depending on the thickness of the junction layer therein. When the thickness of the Josephson junction is too large, a superconducting current cannot flow through the junction. When the thickness is appropriate, the superconducting current can flow through the junction by way of tunneling, without causing voltage difference across the junction, provided that the superconducting current is within the predetermined critical current Ic. When the magnitude of the current has exceeded this critical current Ic, there suddenly appears a voltage across the junction. In the state there is caused such a voltage, the I-V characteristic of the Josephson device approaches a straight line that crosses the origin. The I-V characteristics pertinent to such a Josephson device are called RSJ (Resistivity Shunted Junction) characteristics.

In the case there is a short-circuit in the Josephson junction due to the excessively small thickness of the barrier layer, on the other hand, there gradually appears a voltage across the junction when the current has exceeded the critical current Ic. In this case, the voltage is induced as a result of movement of the magnetic flux, and thus, the foregoing characteristics are called FF (Flux Flow) type I-V characteristics.

In order to realize a superconducting electron device that uses a Josephson device, it is necessary to produce a large number of Josephson junctions and devices having the foregoing RSJ characteristics and having a suitable critical current Ic. Further, the Josephson device is required to have a suitable Ic.Rn product. Particularly, the quantity Ic is sensitive to the junction structure or fabrication process, and thus, it is very important to establish the technology of suppressing the variation of the critical current Ic.

In order to achieve operation of a Josephson integrated circuit including therein 100 or more Josephson junctions, there is an estimate that the variance $1\sigma$ of the junction characteristics has to be suppressed to 10% or less (J. Talvacchio, et al., IEEE Trans. Appl. Supercond.7, pp.2051, 1997) for the Josephson junctions included in the circuit.

Recently, there has been a report announcing the success of achieving the $1\sigma$ value satisfying the foregoing requirement for an IEJ ramp-edge Josephson device.

More specifically, Satoh et al. achieved the variance $1\sigma$ of 8% ($1\sigma=8\%$) over 100 Josephson junctions by using $YBa_2Cu_3O_{7-y}$ for the superconducting electrodes and $(La_{0.3}Sr_{0.7})(Al_{0.65}Ta_{0.35})O_y$ for the insulating layer (T. Satoh, et al., IEEE Trans. Appl. Supercond. 9, 99.3141, 1999). The invention by Satoh et al. is disclosed in Japanese Laid-Open Patent Application 2000-150974.

According to the reference, the proposed process provides excellent junction characteristics because of the homogeneous barrier layer formation between the two superconducting electrodes within the thickness of 2 nm or less and because of incorporation of La into the barrier interface from the insulating layer at the time of etching process.

On the other hand, the amount of La thus incorporated is extremely small and it is not possible to confirm the existence of such La atoms even when a high-resolution analyzer transmission microscope, which conducts element analysis based on a characteristic X-ray emitted in response to irradiation of an electron beam having a beam diameter of as small as about 1 nm, is employed (J. G. Wen, et al., Appl. Phys. Lett., 75, pp.5470, 1999).

On the other hand, Soutome, et al., has successfully achieved the $1\sigma$ value of 7.9% ($1\sigma=7.9\%$) over 100 Josephson junctions at 4.2K, by using $YBa_2Cu_3O_{7-y}$ for the superconducting electrodes and $CeO_2$ for the insulation film (Soutome, et al., 62nd Annual Meeting of Japan Society of Applied Physics 14a-G-7, Sep. 11–14, 2001, Abstract No.1, pp.195). Soutome, et al. does not use a material containing La, and thus, the structure of Soutome, et al. achieves the foregoing result with the structure and process in which there occurs no La incorporation between the two superconducting electrodes.

In the industrial application of Josephson devices, it is mandatory to establish the technology of producing a number of Josephson junctions each having appropriate characteristics, with excellent reproducibility. Particularly, there is a demand of such a technology in the fabrication of future large-scale Josephson integrated circuits.

Conventionally, intensive efforts have been made to form Josephson junctions by using oxide high-temperature superconductors, which are characterized by a high Tc value, in the prospect of realizing superconducting electron devices operable at relatively high temperatures. However, the Josephson junctions obtained so far have suffered from the problem of large variation or scattering of operational characteristics, and because of this, integrated circuits of only a very limited scale have been tested so far. In order to construct an integrated circuit of larger scale, the variance $1\sigma$ of about 8% is not sufficient, and there is an acute demand for the process capable of forming Josephson junctions with much reduced variation of operational characteristics.

Further, not much attention has been paid conventionally to the second superconducting layer, which is formed on the barrier layer of the Josephson junction.

SUMMARY OF THE INVENTION

Accordingly, it is a general object of the present invention to provide a method of forming a Josephson device wherein the foregoing problems are eliminated.

Another and more specific object of the present invention is to provide a fabrication process of a Josephson device capable of forming a stable and reliable Josephson junction therein with reduced variation of junction characteristics, as well as a Josephson device fabricated according to such a method.

Another object of the present invention is to provide a method of fabricating a Josephson device, comprising the steps of:

forming a first superconducting layer on a substrate;

forming an insulating film on said first superconducting layer; and forming a second superconducting layer on said insulating film, wherein said step of forming said second superconducting layer comprises the steps of:

removing said insulating layer at least from a predetermined area of said insulating layer so as to expose said first superconducting layer;

conducting, after said step of removing said insulating layer, a first step of forming said second superconducting layer; and conducting a second step of forming said second superconducting layer on said second superconducting layer formed in said first step.

According to the present invention, reliable and stable Josephson devices are formed with reduced scattering of device characteristics, by conducting the first step, or initial phase, of formation of the second superconducting layer under the condition optimized for formation of a Josephson junction.

In the case of a Josephson device that uses a copper oxide superconductor, there has been a problem, associated with the characteristically small coherent length in such an oxide superconductor system, in that it is difficult to form a reliable barrier layer with reproducibility.

The inventor of the present invention has discovered, in the investigation that constitutes the foundation of the present invention, that the characteristics of the barrier layer in a Josephson junction is determined not only by the formation process of a non-superconducting layer constituting the barrier layer, but also by the deposition process of the second superconducting layer conducted thereafter. Particularly, the condition of film formation for the part of the second superconducting layer close to the barrier layer provides a profound effect on the characteristics of the Josephson junction.

Thus, in order to form a large number of Josephson junctions, and hence a large number of Josephson devices, on a substrate with uniform junction characteristics or device characteristics, it is not sufficient to achieve uniformity for the non-superconductor material forming the individual barrier layers. It is also necessary to achieve uniformity in the process of forming the superconducting layers provided on the barrier layers. Thereby, it should be noted that the best deposition condition for formation of a Josephson junction is not always equal to the optimum deposition condition of a high-quality superconductor.

In the present invention, the formation of the superconducting layer on the barrier layer is conducted in at least two steps. In the first step, the superconducting layer is formed under a condition optimized for maximum uniformity over the junctions on the substrate. After the first step, the deposition of the superconducting layer is continued with a condition optimized for maximum film quality.

Thereby, it is possible to conduct the step of removing the insulating film by removing a part of the first superconducting layer at the same time. By doing so, it is possible to use a modified layer formed on the very surface part of the first superconducting layer as a result of the removing step of the insulating film for the barrier layer of the Josephson junction. With this procedure, it is possible to form extremely uniform barrier layers in the Josephson junctions formed over a wide area of the substrate, and the variation of characteristics of the Josephson junctions, and hence the variation of characteristics of the Josephson devices, is successfully minimized.

Further, it is also possible to conduct the first step of forming the second superconducting layer such that the difference of condition of film formation over different locations on the substrate is minimized as compared with the case of conducting the second step of forming the second superconducting layer.

Thereby, it should be noted that the first step of forming the second superconducting layer can be conducted by using a physical vapor deposition process that uses a plurality of evaporation sources.

Further, it is possible to conduct the first step of forming the second superconducting layer by way of a physical-vapor deposition process conducted such that there is formed an obstacle between an evaporation source and the substrate.

Further, it is possible to conduct the first and second steps of forming the second superconducting layer by way of a physical vapor deposition process in such a manner that the distance between the substrate and the evaporation source is increased in the first step as compared with the second step.

Alternatively, it is possible to conduct the first and second steps of forming the second superconducting layer by way of a physical vapor deposition processes in such a manner that the excitation energy of the evaporation source is reduced in the first step as compared with the second step.

Alternatively, it is possible to conduct the first and second steps of forming the second superconducting layer such that an ambient pressure is increased in the first step as compared with the second step.

Further, it is possible to conduct the first step of forming the second superconducting layer by any of a sputtering process, a vacuum evaporation deposition process and a molecular beam epitaxy process and conduct the second step of forming the second superconducting layer by a laser ablation process.

In a physical vapor deposition process in which a source material is dispersed into a gaseous phase by causing excitation of the source material in a vacuum vessel, it is ideal to cause the source material particles, which are emitted uniformly from an evaporation source provided on a surface, to fall on a substrate disposed parallel to the foregoing surface when it is desired to cause deposition of the source material particles with exactly the same condition over any area of the substrate. In practice, however, it is difficult to construct such a facility. In many cases, deviation of deposition condition is more or less unavoidable. This, however, does not mean that improvement for reducing the deviation of deposition condition is not possible.

In order to homogenize the energy of the particles that fall on a substrate in a physical vapor deposition process, there are generally two alternatives of: 1) provide plural excitation regions or plural high-density regions of high-energy particles; and 2) provide a sufficient distance between the excitation region of the source material or the high-density region of the high energy particles and the substrate.

In the case of laser ablation process, the foregoing excitation region of the source material corresponds to the region of the target to which the laser beam is directed while the high-density region of the high-energy particles corresponds to the plume, which appears at the time of the laser beam irradiation.

In the case of the sputtering process, the excitation region corresponds to the part of the target hit with plasma (called erosion), while the high-density region of the high-energy particles corresponds to the plasma. In the case of vacuum evaporation deposition process or molecular beam epitaxy, the excitation region corresponds to the evaporation source and the high-density region corresponds to the region near the evaporation source.

Further, it is effective also to change the film formation process between the first step and the second step. Generally, the uniformity of energy of the particles depositing on a substrate is increased with the order of: laser ablation process; sputtering process; vacuum evaporation deposition process or molecular beam epitaxy process. Thus, it is possible to conduct the initial deposition process by employing the process of high uniformity, followed by the substantial deposition process by using a process of lower uniformity.

Thus, according to the present invention, it is possible to suppress the variation of device characteristics of the Josephson devices, particularly the variation of critical current Ic, over a wide area of the substrate by conducting the first step of the formation process of the second superconducting layer under the condition chosen such that a uniform energy distribution is achieved for the deposited molecules or particles over wide area of the substrate. Thereby, reliable Josephson devices can be obtained with uniform device characteristics.

The Josephson devices thus fabricated are characterized by the variance $1\sigma$ of the critical current Ic of 8% or less. Thus, according to the present invention, it becomes possible to suppress the value of variance $1\sigma$ of the critical current Ic of the Josephson junctions to 8% or less over 100 Josephson junctions, by conducting the first step of the process of forming the second superconducting layer under the condition set such that a uniform energy distribution is realized for the deposited molecules or particles over a wide area of the substrate. Thus, the present invention successfully realized stable and reliable Josephson devices having a Josephson junction therein.

Other objects and further features of the present invention will become apparent from the following detailed description when read in conjunction with the attached drawings.

DETAILED DESCRIPTION OF THE PREFERRED EMBODIMENT

[Principle]

Figure 1E:
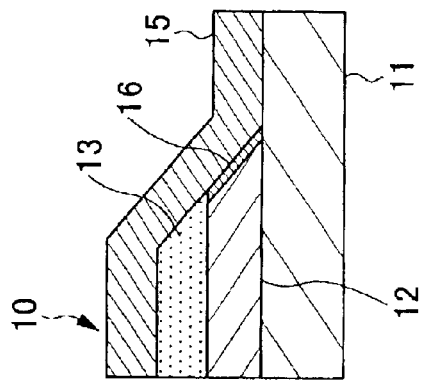
FIGS. 1A–1E are diagrams showing the fabrication process of a Josephson device according to a first embodiment of the present invention.

According to the present invention, reliable and stable Josephson devices are formed with reduced variation of the critical current Ic in the case a large number of Josephson junctions are formed.

In the Josephson devices that use a copper oxide superconductor for the Josephson junction therein, there has been a problem pertinent to such a copper oxide superconductor system that formation of reliable barrier layer with reproducibility is extremely difficult because of the short coherent length.

Thus, intensive efforts have been made on the proper selection of the non-superconductor used for the barrier layer and also on the problem of finding out proper deposition process of such a non-superconductor to form the barrier layer. The inventor of the present invention also made various attempts with regard to the foregoing issue.

During the course of the investigation made by the inventor of the present invention and constituting the foundation of the present invention, it was discovered that the property of the barrier layer is determined not only by the formation process of the non-superconducting layer forming the barrier layer, but also by the deposition process of the superconducting layer conducted after the formation of the non-superconducting layer. Particularly, it was discovered that the deposition condition of the superconducting layer contacting with or located close to the barrier layer provides a profound effect on the characteristics of the Josephson junction.

When to fabricate a superconducting integrated circuit by forming a number of Josephson junctions on a substrate, it is therefore necessary to achieve uniformity not only in the process of forming the non-superconducting layers constituting the barrier layer in the respective Josephson junctions but also in the process of forming the superconducting layers formed on the barrier layers in the respective Josephson junctions.

Thereby, it should be noted that the deposition condition optimum for formation of a barrier layer is not always optimum for the deposition of the superconducting layer formed on the barrier layer.

Thus, the present invention conducts the formation of the superconducting layer formed on the barrier layer in the respective Josephson junctions in two steps. In the first step, the deposition is conducted under a condition optimized such that uniformity is achieved for the Josephson junctions on the substrate. In the second step, on the other hand, the deposition process is optimized such that a high-quality film is obtained for the deposited superconducting layer.

In a physical vapor deposition process in which a source material is dispersed into a gaseous phase by causing excitation of the source material in a vacuum vessel, it is ideal to cause the source material particles, which are emitted uniformly from an evaporation source provided on a surface, to fall on a substrate, disposed parallel to the foregoing surface when it is desired to cause deposition of the source material particles with exactly the same condition over any area, of the substrate. In practice, however, it is difficult to construct such a facility. In many cases, deviation of deposition condition is more or less unavoidable. This, however, does not mean that improvement for reducing the deviation of deposition condition is not possible.

In order to homogenize the energy of the particles that fall on a substrate in a physical vapor deposition process, there are generally two alternatives of: 1) provide plural excitation regions or plural high-density regions of high-energy particles; and 2) provide a sufficient distance between the excitation region of the source material or the high-density region of the high energy particles and the substrate.

In the case of laser ablation process, the foregoing excitation region of the source material corresponds to the region of the target to which the laser beam is directed, while the high-density region of the high-energy particles corresponds to the plume, which appears at the time of the laser beam irradiation.

In the case of the sputtering process, the excitation region corresponds to the part of the target hit with plasma (called erosion), while the high-density region of the high-energy particles corresponds to the plasma. In the case of vacuum evaporation deposition process or molecular beam epitaxy, the excitation region corresponds to the evaporation source and the high-density region corresponds to the region near the evaporation source.

Further, it is effective also to change the film formation process between the first step and the second step. Generally, the uniformity of energy of the particles depositing on a substrate is increased with the order of: laser ablation process; sputtering process; vacuum evaporation deposition process or molecular beam epitaxy process.

Thus, the present achieves the object by conducting the initial deposition process by employing the process of high uniformity, and then conducting the substantial deposition process by using a process of lower uniformity.

[First Embodiment]

Hereinafter, the fabrication process of a Josephson device having a ramp-edge structure and including therein a Josephson junction of an IEJ type will be explained for the case $Y_{0.9}Ba_{1.9}La_{0.2}Cu_3Oy$ is used for the first superconducting layer and $Y_{0.9}Ba_{1.9}La_{0.2}Cu_3Oy$ is used for the second superconducting layer. In the present invention, the first step is conducted by a laser ablation process, in which two laser beams are used to evaporate a target at two different locations. In such a process, therefore, there exist two different evaporation sources in view of the fact that evaporation takes place at the two different locations.

FIGS. 1A–1E show the fabrication process of a Josephson junction 10 according to a first embodiment of the present invention.

Figure 1A:
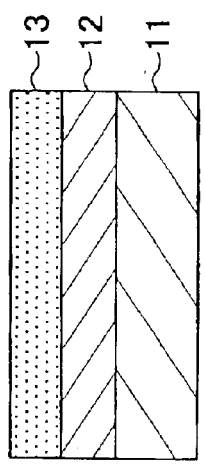

Referring to FIG. 1A, a first superconducting layer 12 of $Y_{0.9}Ba_{1.9}La_{0.2}Cu_3Oy$ is formed on a substrate 11 having a composition of $(La_{0.3}Sr_{0.7})(Al_{0.65}Ta_{0.35})O_3$ called LSAT with a thickness of 200 nm by an off-axis RF sputtering process, wherein the substrate 12 may have a square shape of 10 mm size for each edge. Further, an interlayer insulation film 13 of LSAT is formed on the superconducting layer 12 also by an off-axis RF sputtering process with a thickness of about 200 nm.

Figure 1B:
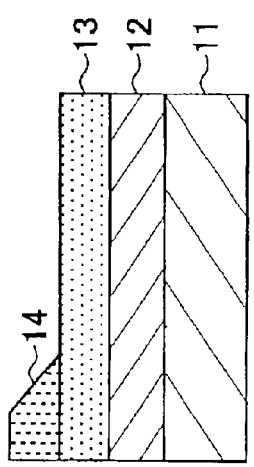

Next, in the step of FIG. 1B, a resist pattern 14 is formed such that the resist pattern 14 has a gently sloping slanted edge on the interlayer insulation film 13, wherein such a resist pattern 14 can be formed by applying a reflowing process to a resist pattern after conducting a photolithographic patterning process to the resist film formed on the interlayer insulation film 13.

Figure 1C:
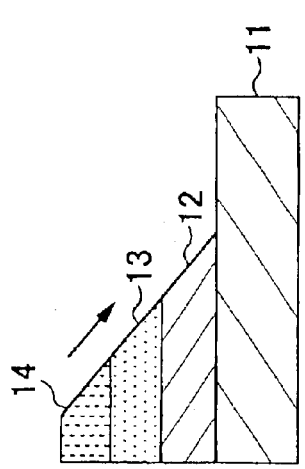

Next, in the step of FIG. 1C, an etching process is conducted in the structure of FIG. 1B while using the resist pattern 14 as a mask, wherein the interlayer insulation film 13 and the first superconducting layer 12 are subjected to an etching process conducted by Ar ion irradiation under the acceleration voltage of 400V with the ion current of 50 mA. In the etching process, it should be noted that the Ar ions are impinged with an incidence angle of 30 degrees with respect to the substrate. The substrate 11 is rotated during the etching process.

As a result of such an etching process, there is formed a gentle slope cutting through the interlayer insulation film 13 and also the first superconducting layer 12 as indicated in FIG. 1C, wherein it should be noted that the surface of the slope is covered with a damaged layer, which is formed by ion bombardment during the etching process.

Figure 1D:
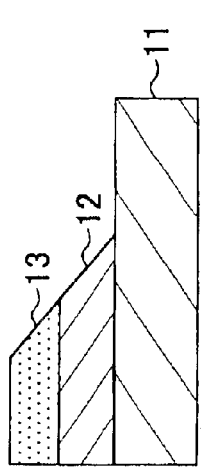

Next, in the step of FIG. 1D, the resist pattern 14 is removed by conducting an ashing process.

The structure of FIG. 1D thus obtained is ready for formation of a second superconducting layer 15 conducted in the step of FIG. 1E by a laser ablation process.

FIG. 2 shows the setup of a substrate 100 and a target 101 used in the laser ablation process for forming the second superconducting layer 15.

Referring to FIG. 2, the laser beam from a laser source is divided into two laser beams, and the two laser beams are directed to the surface of the target 101 at two different locations. Thereby, the target 101 is hit with the two laser beams at the same time. Typically, the target 101 has a size of 30 mm in diameter and is formed of a sintered body of $Yb_{0.9}Ba_{1.9}La_{0.2}Cu_3Oy$. Further, each of the two laser beams is turned on with a rate of five times per second with a power of 300 mJ. Thereby, each of the laser beams forms an energy density of 1.0 $mJ/cm^2$ on the surface of the target 101.

The deposition is conducted at the substrate temperature of 660° C. in an oxygen ambient of 26.6Pa in pressure while setting the distance between the substrate 100 and the target 101 to 60 mm. In order to achieve uniformity of film formation, the substrate 100 and the target 101 are rotated with respective speeds of 3 rpm and 8 rpm, and a mirror is used to deflect the two laser beams. Thereby, the laser beams are moved to scan over the surface of the target 101.

The particles thus excited on the target 101 are emitted into the ambient with kinetic energy and reach the surface of the substrate 100 while causing collision with oxygen molecules in the ambient. The particles thus reached the substrate 100 have lost the initial energy thereof and cause a deposition on the substrate surface.

Figure 2A:
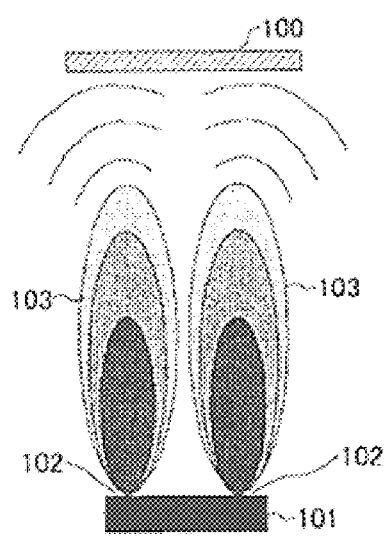
FIGS. 2A–2C are diagrams showing a setup of substrate and target used in a laser ablation process.

In the case of commonly used single laser beam ablation process, it should be noted that there is formed a flame 103 called plume by the particles emitted from the target 101. In the present invention that uses two laser beams, on the other hand, it should be noted that the location-to-location variation of energy of the particles reaching the substrate 100 is minimized as represented in FIG. 2A.

Figure 2B:
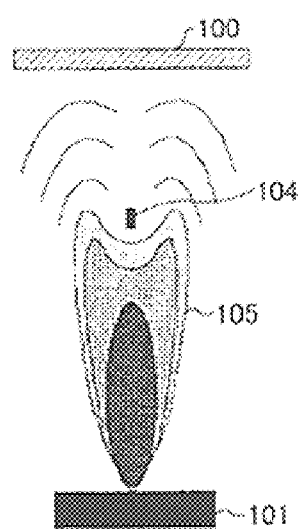
Figure 2C:
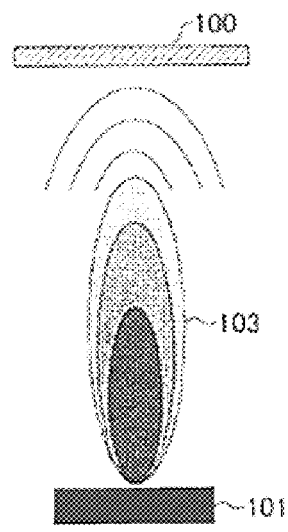

After continuation of the first step for the duration of 10 minutes, the splitting of the laser beam is terminated, and film formation is conducted by using a single laser beams as represented in FIG. 2C. Thereby, the energy of the laser beam is set to 600 mJ and the deposition is conducted for 30 minutes.

As a result of such a process, there is formed a Josephson junction as represented in FIG. 1E in which a barrier layer 16 is sandwiched by the first superconducting layer 12 and the second superconducting layer 15. Further, by forming an Au electrode by depositing an Au layer, followed by a suitable patterning process, there are formed a number of Josephson devices on the substrate 11. Thereby, there is formed a Josephson integrated circuit 1 as represented in FIG. 3.

Figure 3:
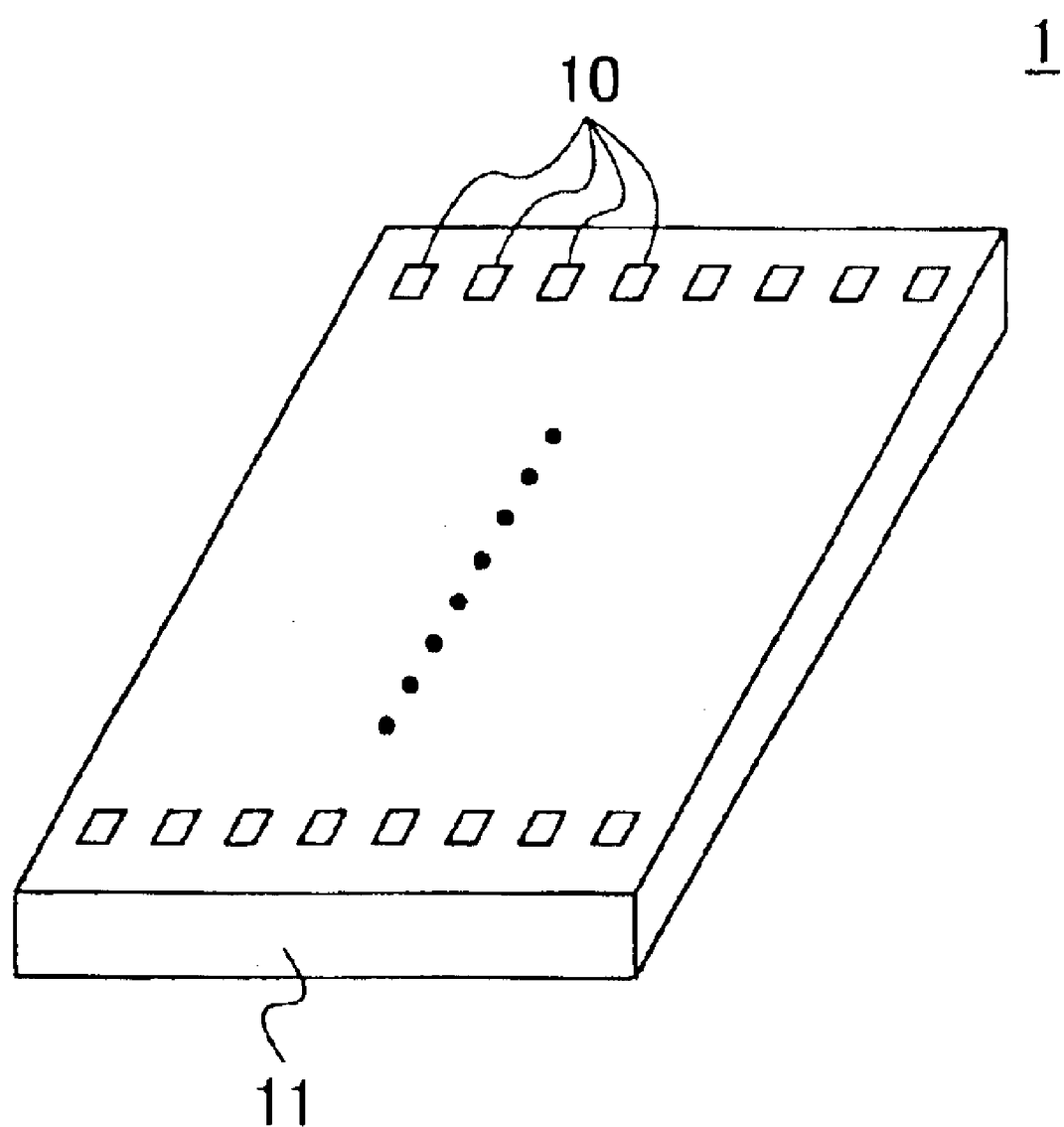
FIG. 3 is a diagram showing a Josephson integrated circuit formed by the Josephson devices of the first embodiment.

In an example, ten isolated Josephson junctions and one hundred Josephson junctions connected in series are formed uniformly in the square area of 6 mm×6 mm of the substrate 11 in the Josephson integrated circuit of FIG. 3.

It turned out that all the ten Josephson junctions on the substrate 11 has the I-V characteristics pertinent to an RSJ type junction. In these Josephson junctions thus formed, the Ic.Rn product at 4.2K was 2.1–2.6 mV, and the critical current Ic was about 0.9 mA. Further, it was confirmed that the variance $1\sigma$ of the critical current Ic was 6.2% for the foregoing one hundred junctions.

FIRST COMPARATIVE EXAMPLE

In a first comparative example, Josephson devices of the ramp-edge structure were formed similarly to the first embodiment explained above except that the first step of forming the second superconducting layer by using two laser beams simultaneously is omitted.

In this first comparative example, it was confirmed that the ten isolated Josephson junctions on the substrate have the I-V characteristics of the RSJ type and that these Josephson junctions have the Ic.Rn product of 1.9–2.7 mV at 4.2K. The critical current Ic was about 0.9 mA. The variance $1\sigma$ measured for the one hundred junctions was 12.5% in this comparative example, wherein it should be noted that the value of this variance is much larger than the variance achieved in the first embodiment.

SECOND COMPARATIVE EXAMPLE

In a second comparative example, Josephson devices of the ramp-edge structure have been formed similarly to the first embodiment except that the two laser beams used in the first step of forming the second superconducting layer 15 was continued also in the rest of the process of forming the remaining part of the second superconducting layer 15. Thus, the process of FIG. 2C of using the single laser beam was not employed in this second comparative example.

In this second comparative example, it was shown that only eight out of the ten Josephson junctions have the RSJ type I-V characteristics while the remaining two have the FF-type I-V characteristics. Microscopic examination conducted on the surface of the second superconducting layer after formation of the second superconducting layer revealed that there are larger number of granular precipitates as compared with the first embodiment, suggesting that short circuit has been caused at the Josephson junction by such precipitates.

Thus, it is concluded that Josephson junctions having excellent characteristics can be obtained by forming the second superconducting layers first by irradiating the target by using two laser beams simultaneously to cause a deposition of the particles emitted from two evaporation sources. The Josephson junctions thus formed are characterized by the variance $1\sigma$ of 6.2% for the critical current Ic and a high value of 2.1–2.6 mV for the Ic.Rn product.

Further, it is preferable to conduct the second step of forming the second superconducting layer by using a single high-power laser beam.

[Second Embodiment]

In a second embodiment of the present invention, there is provided a process of fabricating a Josephson device of the ramp-edge structure in which the Josephson junction is formed by an IEJ process that uses the first and second superconducting layers similarly to the first embodiment, wherein the present embodiment differs from the first embodiment in the point that the present embodiment conducts the first step of forming the first superconducting layer by providing an obstacle between the substrate and the target.

Hereinafter, the fabrication process of the Josephson device of the present embodiment will be described.

In the present embodiment, the process up to the step immediately before the step of forming the second superconducting layer is conducted similarly to the first embodiment.

In the present embodiment, the second superconducting layer is formed by a laser ablation process.

More specifically, an obstacle 104 of a Ni alloy such as INCONEL (trademark) having a rectangular bar shape is provided between the substrate 100 and the target 101 in the present embodiment as represented in FIG. 2B.

The deposition is conducted by irradiating the laser beam of 600 mJ to the target 101 with the rate of 5 times per second, and the particles emitted from the target 101 are deposited on the substrate 101. Thereby, the particles excited on the target 101 by the laser beam are emitted into the ambient with kinetic energy and reach the substrate 100 while causing collision with oxygen in the ambient. The particles thus reached the substrate 100 have lost the initial energy thereof and cause a deposition on the substrate surface.

In the case of commonly used single laser beam ablation process, it should be noted that there is formed a flame 103 called plume by the particles emitted from the target 101. In the present embodiment, on the other hand, it should be noted that the location-to-location variation of energy of the particles reaching the substrate 100 is minimized because of formation of a modified plume 105 caused by the obstacle 104 as represented in FIG. 2B. In the modified plume 105, the obstacle 104 functions to reduce the number of the particles depositing on the substrate 100 and hence the deposition rate of the second superconducting layer 15, while such a reduction of the deposition rate simultaneously provides beneficial effect of facilitating the desired uniformity of the deposition process by reducing the energy difference of the particles arriving at the substrate 100.

In the present embodiment, it was confirmed that all the ten isolated Josephson junctions formed on the substrate 101 have the RSJ I-V characteristics and the Ic.Rn product thereof was 2.0–2.6 mV. Further, the critical current Ic of these Josephson junctions was about 0.5 mA. Further, it was confirmed that the variance 1σ of the critical current Ic was 6.6% for the foregoing one hundred junctions.

Thus, by suppressing the high-energy portion of the particle kinetic energy by providing the obstacle between the substrate and the target during the first step of the process of forming the second superconducting layer, and thus by reducing the energy variation of the particles arriving at the substrate, the present embodiment successfully suppresses the variance 1σ of the critical current Ic to 6.6% and the Ic.Rn product to 2.0–2.6 mV. Thereby, a Josephson device having excellent performance is obtained.

[Third Embodiment]

In a third embodiment of the present invention, there is provided a fabrication process of a Josephson device of the ramp-edge structure including therein a Josephson junction formed by the IEJ process, wherein the present embodiment forms the Josephson device by using the first and second superconducting layers similarly to the first embodiment.

On the other hand, the present invention differs from the first embodiment in the point that the first step of forming the second superconducting layer is conduced by an off-axis RF sputtering process that uses two sputtering cathodes disposed so as to oppose with each other in place of the laser ablation process.

Hereinafter, the fabrication process of the Josephson device of the present embodiment will be described.

In the present embodiment, the process up to the step immediately before the step of forming the second superconductor is conducted similarly to the first embodiment. On the other hand, the second superconductor is conducted by an off-axis RF sputtering process.

Figure 4A:
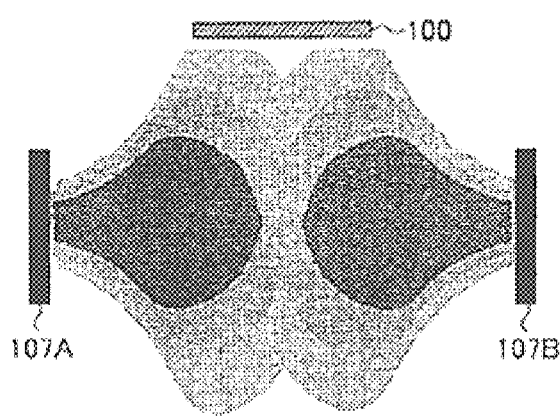
FIGS. 4A and 4B are diagrams showing a setup of substrate and target in an off-axis RF sputtering process.
Figure 4B:
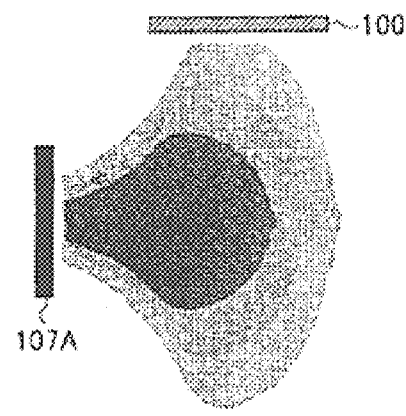

FIGS. 4A and 4B show the setup of the substrate 100 and a target 107 used in an off-axis RF sputtering process, wherein FIGS. 4A and 4B show the kinetic energy distribution of the sputter molecules. In the drawings, it should be noted that the dark area represents the part where the kinetic energy of the particles is large, while the light area represents the part where the kinetic energy of the particles is small. In FIGS. 3A and 3B, illustration of the sputter cathode provided on the target 107 is omitted.

As represented in FIG. 4A, two targets 107A and 107B disposed so as to oppose with each other are used in the first step of forming the second superconducting layer. By using the two targets 107A and 107B as represented in FIG. 4A, it becomes possible to reduce the location-to-location variation of the kinetic energy of the particles arriving at the substrate 100 as compared with the case of using a single target 107A as represented in FIG. 4B.

After conducting the film formation for the first step by using the two targets 107A and 107B for 15 minutes, the second step is conducted by using a single sputter cathode 107A.

In the present embodiment, the ten isolated Josephson junctions thus formed on the substrate showed the I-V characteristics of RSJ type. Further, the Ic.Rn product at 4.2K was 1.9–2.6 mV. The critical current Ic was about 1.0 mA. The variance 1σ of the critical current Ic for the one hundred junctions turned out to be 6.9%.

Thus, according to the present embodiment, it is possible to suppress the variance 1σ of the critical current Ic to 6.9% by conducting the first step of the film formation process of the second superconducting layer 15 by using the off-axis RF sputtering process while using the two, mutually opposing targets 107A and 107B. By doing so, Josephson devices of high performance characterized by high Ic.Rn product of 1.9–2.6 mV is successfully achieved.

It is also possible to continue the process that uses the two sputtering cathodes also in the second step of forming the second superconducting layer 15. However, it is generally difficult to continue the film formation while maintaining a predetermined film quality and simultaneously suppressing the target erosion when plural cathodes are used. It should be noted that the film formation process by a sputtering process depends heavily on the nature of the cathode used for the sputtering or the quality of the sputter target. Increase of number of the cathode means increases of number of the items to be controlled for maintaining the film quality. Thus, it is desirable to use as small number of the cathodes as possible in the second step of forming the second superconducting layer.

In the first step, on the other hand, the uniformity of the deposition condition over the substrate is most important.

More specifically, it is most important to realize a uniform energy distribution for the particles deposited on the substrate. For this to be achieved, the present two-step film formation process is extremely effective.

[Fourth Embodiment]

In a fourth embodiment of the present invention, a fabrication process of a Josephson device of the ramp-edge structure is provided wherein the Josephson device of the present embodiment includes a Josephson junction formed by the IEJ process by using the first and second superconducting layers similarly to the first embodiment.

On the other hand, the present invention differs from the first embodiment in the point that the first step of forming the second superconducting layer is conducted by a laser ablation process in such a state that the distance between the substrate and the target is increased as compared with the second step.

Hereinafter, the fabrication process of the Josephson device will be explained in more detail.

In the present embodiment, too, the process up to the step immediately before the step of forming the second superconducting layer is conducted similarly to the first embodiment. Further, the second superconducting layer is conducted by a laser ablation process in the present embodiment.

More specifically, the laser ablation process is conducted by irradiating the target 101 with the laser beam of 600 mJ energy with the frequency of 5 times per second. Thereby, the energy density on the surface of the target 101 was 1.0 mJ/cm$^2$. The deposition was conducted at the substrate temperature of 660° C. while setting the oxygen ambient pressure to 26.6 Pa. In order to achieve uniformity of the film quality, the substrate 100 and the target 101 were rotated with respective speeds of 3 rpm and 8 rpm. Further, the laser beam is caused to scan over the target 101 by moving a mirror.

Figure 5A:
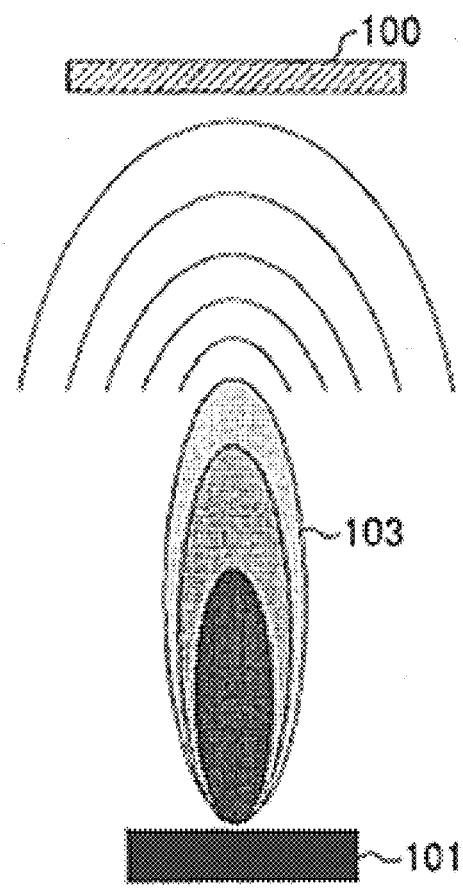
FIGS. 5A and 5B are diagrams showing a setup of substrate and target in a laser ablation process according a fifth embodiment of the present invention.
Figure 5B:
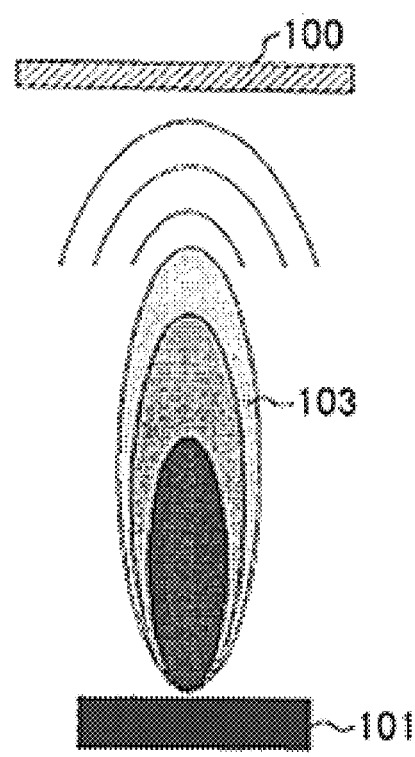

As represented in FIG. 5A, the film formation process for the first step is conducted by increasing the distance between the substrate 100 and the target 101, while the distance is reduced in the second step as represented in FIG. 5B. More specifically, the first step uses the distance of 80 mm, while the second step uses the distance of 60 mm.

As can be seen in FIG. 5A, the substrate is located clearly outside of the plume 103, and thus, the kinetic energy of the particles arriving at the substrate 100 is reduced. Such a condition is not optimum for the formation of high-quality superconductor film. On the other hand, in the arrangement of FIG. 5A, the variation of kinetic energy of the particles arriving at the substrate 100 is reduced by increasing the distance between the substrate 100 and the target 101.

In the present embodiment, the ten junctions formed on the substrate 11 showed the I-V characteristics of the RSJ type, and the Ic.Rn product at 4.2K was 2.0–2.4 mV. The critical current Ic was about 0.8 mA. The variance 1σ of the critical current Ic for the one hundred junctions was 6.0%.

From the foregoing, it is concluded that the variance 1σ of the critical current Ic can be reduced to 6.0% by increasing the distance between the substrate and the target in the first step of formation of the second superconducting layer 15 as compared with the second step. By doing so, a Josephson device having excellent characteristics and having a large Ic.Rn product of 2.0–2.4 mV can be obtained.

[Fifth Embodiment]

In a fifth embodiment of the present invention, there is provided a method of fabricating a Josephson device having the ramp-edge structure, wherein the Josephson device includes a Josephson junction formed by the IEJ process that uses the first and second superconducting layers similarly to the first embodiment. The present embodiment differs from the first embodiment in the point that the energy of the laser beam used in the laser ablation process is reduced to 300 mJ in the first step of the process for forming the second superconducting layer.

Hereinafter, the fabrication process of the Josephson device will be explained in more detail.

In the present embodiment, the process up to the step immediately before the step of forming the second superconducting layer is identical with the process of the first embodiment.

In the present embodiment, the first step of forming the superconducting-layer 15 is conducted by a laser ablation process similarly to the first embodiment, wherein the laser ablation process is conducted by irradiating the target 101 by a laser beam having a laser power of 300 mJ with the frequency of 5 times per minute in the state that the distance between the substrate and the target is set to 60 mm. The laser ablation process itself is conducted under the condition identical with the condition used in the fourth embodiment except for the laser beam power.

Figure 6:
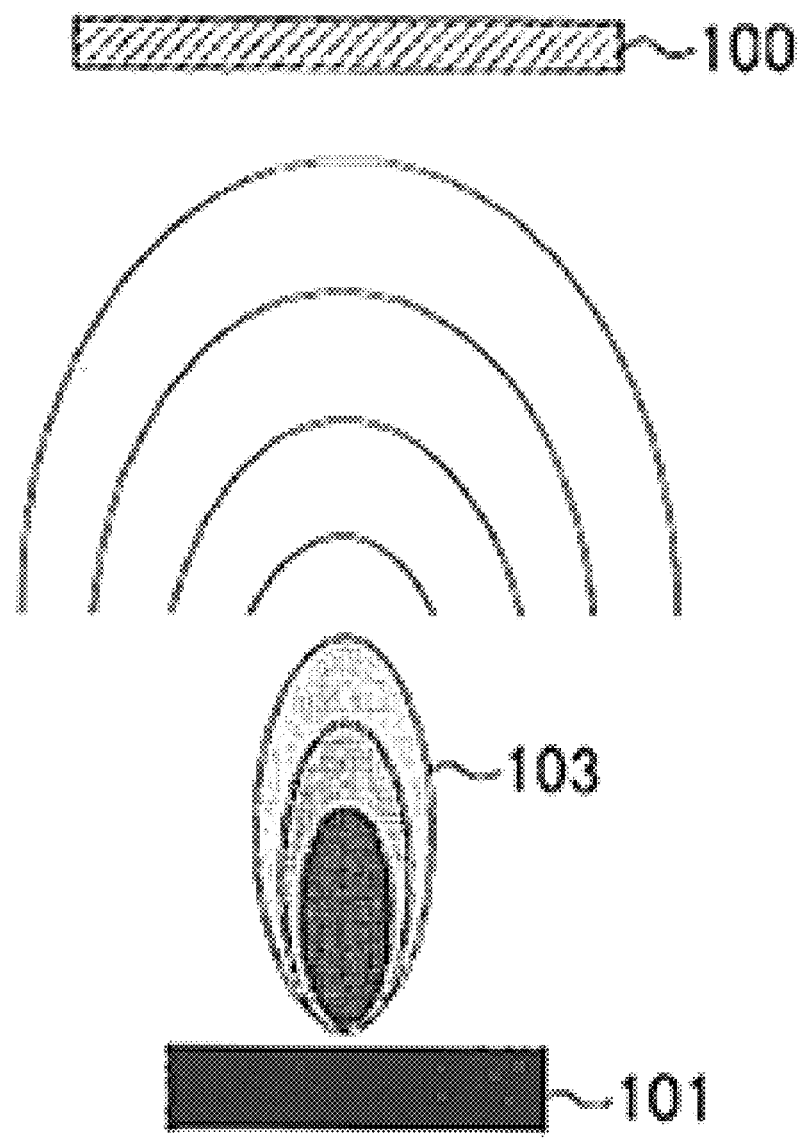
FIG. 6 is a diagram showing a setup of substrate and target in a laser ablation process according to a sixth embodiment of the present invention.

FIG. 6 shows the arrangement of the substrate 100 and the target 101 used in the laser ablation process according to the present embodiment.

Referring to FIG. 6, it will be noted that the size of the plume 103 is reduced as compared with the case of FIG. 5B as a result of the decrease of the laser beam power to 300 mJ, and the substrate 100 is located clearly outside the plume 103. As a result, the energy of the particles arriving at the substrate is reduced. Thus, this is not the optimum condition for forming a high-quality superconductor film. On the other hand, because of the reduced energy of the particles arriving at the substrate, the variation of energy of the particles is reduced in the present embodiment.

In the present embodiment, all the ten junctions formed on the substrate 11 showed the I-V characteristics of RSJ type, and the Ic.Rn product at 4.2K was 1.9–2.4 mV. The critical current Ic was about 0.8 mA. The variance 1σ of the critical current Ic for the one hundred junctions was 7.0%.

From the foregoing, it is concluded that the variance 1σ of the critical current Ic can be reduced to 7.0% by reducing the laser beam energy, and hence the kinetic energy of the particles arriving at the substrate, in the first step of formation of the second superconducting layer 15. By doing so, a Josephson device having excellent characteristics and having a large Ic.Rn product of 1.9–2.4 mV can be obtained.

[Sixth Embodiment]

In a sixth embodiment of the present invention, there is provided a method of fabricating a Josephson device having the ramp-edge structure, wherein the Josephson device includes a Josephson junction formed by the IEJ process that uses the first and second superconducting layers similarly to the first embodiment, wherein the present embodiment conducts the foregoing first step of forming the second superconducting layer by increasing the pressure of the oxygen ambient to 53.2 Pa.

Hereinafter, the fabrication process of the Josephson device will be explained in more detail.

In the present embodiment, the process up to the step immediately before the step of forming the second superconducting layer is identical with the process of the first embodiment.

In the present embodiment, the first step of forming the superconducting layer 15 is conducted by a laser ablation process similarly to the first embodiment, wherein the laser ablation process is conducted by setting the distance between the substrate and the target to 60 mm and by setting the pressure of the oxygen ambient gas to 53.2 Pa.

By increasing the oxygen gas pressure, the number of collision of the particles emitted from the target with oxygen molecules is increased, and thus, the particles lose the energy quickly. As a result, the size of the plume is reduced similarly to the fifth embodiment.

In the present embodiment, the substrate is located at the position clearly outside the plume thus having a reduced size in the first step, and thus, the particles arriving at the substrate have a reduced kinetic energy. Thus, the first step is conducted under the condition not optimum for forming a high-quality superconductor film. On the other hand, the variation of energy of the particles arriving at the substrate 101 is reduced.

In the present embodiment, all the ten junctions formed on the substrate 11 showed the I-V characteristics of RSJ type, and the Ic.Rn product at 4.2K was 2.1–2.7 mV. The critical current Ic was about 1.0 mA. The variance 1σ of the critical current Ic for the one hundred junctions was 7.1%.

From the foregoing, it is concluded that the variance 1σ of the critical current Ic can be reduced to 7.1% by increasing the pressure of the oxygen ambient gas, and hence the kinetic energy of the particles arriving at the substrate, in the first step of formation of the second superconducting layer 15. By doing so, a Josephson device having excellent characteristics and having a large Ic.Rn product of 2.1–2.7 mV can be obtained.

[Seventh Embodiment]

Hereinafter, the fabrication process of a Josephson device according to a seventh embodiment of the present invention will be described wherein the Josephson device of the present embodiment has a ramp-edge structure and includes therein a Josephson junction formed by an artificial non-superconducting barrier layer of $PrBa_2Cu_3O_y$. In the present embodiment, $Y_{0.9}Ba_{1.9}La_{0.2}Cu_3Oy$ is used for the first superconducting layer and $Y_{0.9}Ba_{1.9}La_{0.2}Cu_3Oy$ is used for the second superconducting layer.

Hereinafter, the fabrication process a Josephson device 20 of the present embodiment will be described.

FIGS. 7A–7E show the fabrication process of the Josephson device 20.

Figure 7E:
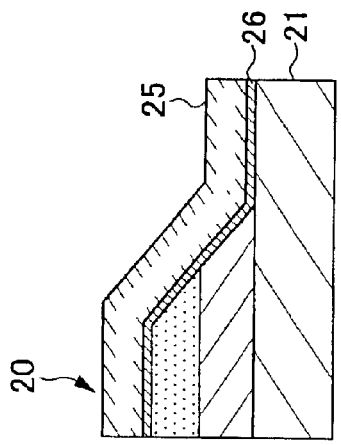
FIGS. 7A–7E are diagrams showing the fabrication process of a Josephson device according to a seventh embodiment of the present invention.
Figure 7A:
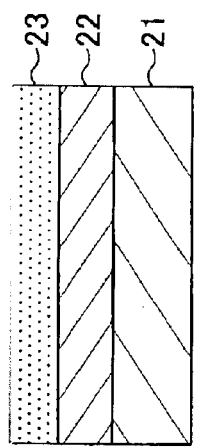

Referring to FIG. 7A, a first superconducting layer 22 of $Y_{0.9}Ba_{1.9}La_{0.2}Cu_3O_y$ is formed on a substrate 21 by an off-axis RF sputtering process with a thickness of 200 nm, wherein the substrate 22 may be an MgO substrate having a square shape of 10 mm size for each edge. Further, an interlayer insulation film 23 of $CeO_2$ is formed on the superconducting layer 22 also by an off-axis RF sputtering process with a thickness of about 200 nm.

Figure 7B:
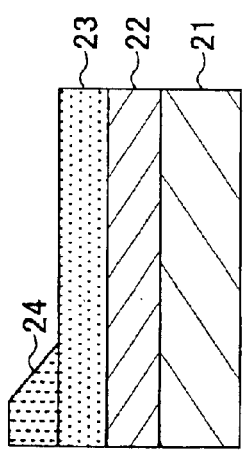

Next, in the step of FIG. 7B, a resist pattern 24 is formed such that the resist pattern 24 has a gently sloping slanted edge on the interlayer insulation film 23, wherein such a resist pattern 24 can be formed by applying a reflowing process to a resist pattern after conducting a photolithographic patterning process of a resist film formed on the interlayer insulation film 23.

Figure 7C:
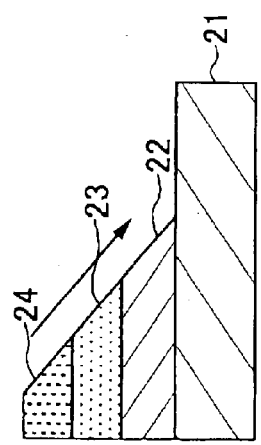

Next, in the step of FIG. 7C, an etching process is conducted in the structure of FIG. 7B while using the resist pattern 24 as a mask, wherein the interlayer insulation film 23 and the first superconducting layer 22 are subjected to an etching process conducted by Ar ion irradiation under the acceleration voltage of 400V with the ion current of 50 mA. In the etching process, it should be noted that the Ar ions are impinged with an incidence angle of 30 degrees with respect to the substrate. The substrate 11 is rotated during the etching process.

As a result of such an etching process, there is formed a gentle slope cutting through the interlayer insulation film 23 and also the first superconducting layer 22 as indicated in FIG. 7C, wherein it should be noted that the surface of the slope is covered with a damaged layer, which is formed by ion bombardment during the etching process.

Figure 7D:
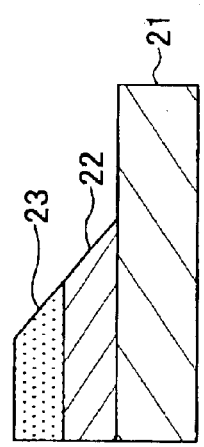

In the present embodiment, this damaged layer is removed by a diluted phosphoric acid, Next, in the step of FIG. 7D, the resist pattern 24 is removed by conducting an ashing process.

Next, in the step of FIG. 7E, a barrier layer 26 of $PrBa_2Cu_3Oy$ is deposited on the structure of FIG. 7D thus obtained by using an off-axis RF sputtering process with a thickness of 5 nm.

Further, a second superconducting layer 25 is formed on the barrier layer 26 in the step of FIG. 7E, wherein the step of forming the second superconducting layer 25 includes a first step of depositing a $Yb_{0.9}Ba_{1.9}La_{0.2}Cu_3Oy$ layer with a thickness of 10nm and a second step of depositing another $Y_{0.9}Ba_{1.9}La_{0.2}Cu_3O_y$ layer on the $Yb_{0.9}Ba_{1.9}La_{0.2}Cu_3Oy$ layer formed in the first step, by conducting a laser ablation process.

As a result, the Josephson device 20 includes a Josephson junction in which the barrier layer 26 is sandwiched by the first superconducting layer 22 and the second superconducting layer 25.

After formation of the structure of FIG. 7E, an Au electrode is formed by depositing an Au layer, followed by a suitable patterning process, and thus, there are formed a number of Josephson devices on the substrate 21. In an example, ten isolated Josephson junctions and one hundred Josephson junctions connected in series are formed uniformly in the square area of 6 mm×6 mm of the substrate 21.

It turned out that all the ten Josephson junctions on the substrate 21 has the I-V characteristics pertinent to an RSJ type junction. In these Josephson junctions, the Ic.Rn product at 4.2K was 1.8–2.4 mV, and the critical current Ic was about 0.8 mA. Further, it was confirmed that the variance 1σ of the critical current Ic was 7.2% for the foregoing one hundred junctions.

THIRD COMPARATIVE EXAMPLE

In a third comparative example, Josephson devices of the ramp-edge structure were formed similarly to the sixth embodiment explained above except that the first step of forming the second superconducting layer by using off-axis RF sputtering process is omitted. In the third comparative example, the film formation condition was identical with the case of the sixth embodiment except for the foregoing first step.

In this third comparative example, it was confirmed that the ten isolated Josephson junctions on the substrate have the I-V characteristics of the RSJ type and that these Josephson junctions have the Ic.Rn product of 1.8–2.7 mV at 4.2K. The critical current Ic was about 0.8 mA. The variance 1σ measured for the one hundred junctions was 10.2% in this comparative example, wherein it should be noted that the value of this variance is much larger than the variance achieved in the sixth embodiment.

Thus, it is concluded that Josephson junctions having excellent characteristics can be obtained by forming the second superconducting layers first by using an off-axis RF sputtering process characterized by small kinetic energy of the particles arriving at the substrate surface and hence having small variation of kinetic energy. The Josephson junctions thus formed are characterized by the variance 1σ of 7.2% for the critical current Ic and a high value of 1.8–2.4 mV for the Ic.Rn product.

It should be noted that the first step of the present embodiment is not limited to the off-axis RF sputtering process, but other processes such as sputtering process, vacuum evaporation deposition process or molecular beam epitaxy process may also be used.

Further, it should be noted that the present invention is not limited to the Josephson device having the ramp-edge structure but, is applicable also to the Josephson devices of laminated structure, including the case in which the Josephson junction in therein is formed by the IEJ process or by an artificial non-superconducting barrier.

What is claimed is:

1. A method of fabricating a Josephson device, comprising the steps of:
    forming a first superconducting layer on a substrate;
    forming an insulating film on said first superconducting layer; and
    forming a second superconducting layer on said insulating film,
    wherein said step of forming said second superconducting layer comprises the steps of:
        removing said insulating layer at least from a predetermined area so as to expose said first superconducting layer;
        conducting, after said step of removing said insulating layer, a first step of forming said second superconducting layer; and
        conducting a second step of forming said second superconducting layer directly on said second superconducting layer formed in said first step, wherein the first step is performed with a first set of conditions and the second step is performed with a second set of conditions, and wherein the first and second set of conditions are not identical.

2. A method as claimed in claim 1, wherein said step of removing said insulating layer comprises the step of removing a part of said first superconducting layer.

3. A method as claimed in claim 1, wherein said first step is conducted with greater uniformity than said second step.

4. A method as claimed in claim 1, wherein said first step is conducted by a physical vapor deposition process while using a plurality of evaporation sources simultaneously.

5. A method as claimed in claim 1, wherein said first step is conducted by a physical vapor deposition process while providing an obstacle between said substrate and an evaporation source.

6. A method as claimed in claim 1, wherein said first and second steps are conducted by a physical vapor deposition process, and wherein said first step is conducted with an increased distance between said substrate and an evaporation source as compared with said second step.

7. A method as claimed in claim 1, wherein said first and second steps are conducted by a physical vapor deposition process, and wherein said first step is conducted with a reduced energy of an evaporation source as compared with said second step.

8. A method as claimed in claim 1, wherein said first and second steps are conducted by a physical vapor deposition process, and wherein said first step is conducted with an increased ambient pressure as compared with said second step.

9. A method as claimed in claim 1, wherein said first step is conducted by any of a sputtering process, a vacuum evaporation deposition process and a molecular beam epitaxy process, and wherein said second step is conducted by a laser ablation process.

* * * * *